(12) United States Patent
Nickel

(10) Patent No.: US 10,310,045 B2
(45) Date of Patent: Jun. 4, 2019

(54) METHOD AND APPARATUS FOR ALLOCATING ACQUIRED MAGNETIC RESONANCE DATA TO RESPECTIVE MOVEMENT STATES OF THE SUBJECT

(71) Applicant: Siemens Healthcare GmbH, Erlangen (DE)

(72) Inventor: Marcel Dominik Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 171 days.

(21) Appl. No.: 15/405,697

(22) Filed: Jan. 13, 2017

(65) Prior Publication Data

US 2017/0199263 A1    Jul. 13, 2017

(30) Foreign Application Priority Data

Jan. 13, 2016   (DE) .................. 10 2016 200 293

(51) Int. Cl.
*G01R 33/56*   (2006.01)
*G01R 33/563*  (2006.01)
*G01R 33/565*  (2006.01)
*G01R 33/567*  (2006.01)

(52) U.S. Cl.
CPC ... *G01R 33/56509* (2013.01); *G01R 33/5608* (2013.01); *G01R 33/5676* (2013.01); *G01R 33/56391* (2013.01)

(58) Field of Classification Search
CPC .......... G01R 33/56509; G01R 33/5608; G01R 33/56391; G01R 33/5676
See application file for complete search history.

(56) References Cited

U.S. PATENT DOCUMENTS

| | | | | |
|---|---|---|---|---|
| 2006/0244445 | A1* | 11/2006 | Sussman | G01R 33/565 324/307 |
| 2013/0278263 | A1 | 10/2013 | Huang et al. | |
| 2014/0296698 | A1* | 10/2014 | Bauer | G01R 33/56509 600/411 |
| 2015/0212182 | A1* | 7/2015 | Nielsen | G01R 33/56509 702/191 |
| 2015/0374237 | A1 | 12/2015 | Hu et al. | |

FOREIGN PATENT DOCUMENTS

CN          104020430 A       9/2014

* cited by examiner

*Primary Examiner* — Rodney A Bonnette
(74) *Attorney, Agent, or Firm* — Schiff Hardin LLP

(57) ABSTRACT

In a method and apparatus for allocating MR imaging signals from a person under examination to N different movement states that occur in the person under examination. MR signals are acquired for the creation of MR images that represent at least one region of the person under examination. A number of MR navigator data sets of the person under examination also are acquired. A cluster analysis is applied to the MR navigator data sets in order to identify similarities in the MR navigator data sets. Similar navigator data sets are allocated to a movement state of the person under examination, the multiple navigator data sets all being allocated respectively to one movement state of the N movement states. The MR imaging signals acquired thus can be allocated to the N movement states.

21 Claims, 3 Drawing Sheets

METHOD AND APPARATUS FOR ALLOCATING ACQUIRED MAGNETIC RESONANCE DATA TO RESPECTIVE MOVEMENT STATES OF THE SUBJECT

BACKGROUND OF THE INVENTION

Field of the Invention

The present invention concerns a method for allocating acquired MR signals (raw data) from a person under examination to N different movement states that occur in the person under examination. The invention further concerns an associated MR system. Furthermore, the invention concerns a method for generating MR navigator data of a person under examination, which can be used for determining movement states that occur in the person under examination, and an MR system suitable for this is purpose.

Description of the Prior Art

Currently, scans to acquire raw MR data from the abdominal region that are to be transformed into image data are usually carried out using the breath-holding technique, which means that the person under examination must hold his or her breath during the acquisition of the MR signals. Through the use of iterative reconstruction techniques, scan methods are being made possible that are more robust with regard to movement artifacts and that simultaneously have a sufficiently high spatial and temporal resolution. These scans can also be carried out during free breathing by the person under examination. For this purpose, however, precise information concerning the breathing movement of the person under examination during the acquisition of the MR signals is necessary.

In general it is known, for determining the movement of a person under examination, to carry out navigator scans. In these navigator scans, typically MR signals are acquired in a relatively short scan time from particular regions of the person under examination and conclusions about the movement can be made in these MR images, for example, from the position of the diaphragm or the abdominal wall. However, these navigator scans differ in their imaging sequences and imaging parameters from the imaging sequences that are used for the actual diagnostic MR imaging.

SUMMARY OF THE INVENTION

An object of the present invention is to improve MR scans of a person under examination when parts of the person under examination move during the MR signal acquisition. In particular, the movement states of the person under examination are to be identified in an effective manner.

According to a first aspect of the invention, a method is provided for allocating MR imaging signals from a person under examination to N different movement states occurring in the person under examination that includes the following steps.

MR imaging signals for the creation of MR images are acquired, representing at least one region of the person under examination. In addition, a number of MR navigator data sets regarding the person under examination are acquired. Furthermore, a cluster analysis of the plurality of MR navigator data sets is implemented in a processor in order to identify similarities in the MR navigator data sets, similar navigator data sets being allocated to a movement state of the person under examination. The totality of the multiple navigator data sets all individually thereby result in being allocated to one of the N movement states. Subsequently, the MR imaging signals acquired can be allocated to the N movement states based on this allocation of the navigator data sets to the N movement states.

Through the use of cluster methods on the navigator data sets, the navigator data sets can be assembled into individual clusters. In the cluster analysis, the navigator data sets acquired are assembled into different groups of similar navigator data sets, the found groups containing similar navigator data defining a movement state.

This data-driven use of cluster analysis on navigator data sets enables the movement present in the person under examination to be subdivided in an effective way into N pre-determined movement states.

It is possible that during the acquisition of the MR navigator data, at least one RF excitation pulse is used that is identical to the at least one RF excitation pulse that is used during the acquisition of the MR signals used for imaging. The fact that during the acquisition of the navigator data and during the acquisition of the diagnostic MR signals, identical RF excitation pulses are used means that a possible equilibrium state of the magnetization in which the acquisition of the MR imaging signals occurs is not disrupted. Thus, the acquisition of the MR navigator data sets can take place effectively in parallel with the acquisition of the MR imaging signals.

It is further possible that during the acquisition of the MR navigator data, the same excitation volumes are excited in the person under examination as during the acquisition of the diagnostic MR signals. Through the excitation of the same excitation volume, it is further achieved that the acquisition of the multiple navigator data sets does not influence the acquisition of the MR imaging signals, since apart from the same RF excitation coil, the same excitation volume is used.

A difference in the acquisition of the MR navigator data from the acquisition of the diagnostic MR signals can be that, during the acquisition of the MR navigator data sets, a signal readout direction is parallel to the primary movement direction that is present in the person under examination. Thus the movements of the person under examination such as, a breathing movement, can be readily detected in the navigator data.

Following the use of the cluster analysis and the determination of the N movement states, each raw data point of the acquired diagnostic MR signals can be allocated to one of the N movement states.

The MR imaging signals can be reconstructed into MR images using an iterative reconstruction. The movement state associated with the imaging signals can be used as an additional dimension in the iterative reconstruction.

In the reconstruction of the MR imaging data to form the MR images, the reconstructed MR images can be used to check whether the allocation of the imaging signals to the N movement states should be adjusted. For this purpose, a representative MR image can be determined for each of the N movement states, and the N representative MR images can be compared with the reconstructed MR images. The allocation of the MR imaging signals can be renewed if the allocation is not satisfactory, i.e. if the comparison does not fulfill a pre-determined criterion.

As is known, the acquired raw MR signals are entered in numerical values into a memory at respective points in the memory. The collection of such data in the memory being called k-space. The reconstruction of images is undertaken on the k-space data.

Following calculation of representative images for each movement state, these images can be transformed back into k-space with the use of the signal model, in a normal case by pixel-by-pixel multiplication with reception coil sensitivity maps, as are used in the reconstruction, and subsequent Fourier transformation. Each measured image data point in the representative image region can then be compared with the thus-calculated movement images in k-space (e.g. via a distance norm or correlation). Each representative image data point can then be associated with the nearest placed movement image.

For the selection of the representative images, a decoupling in the readout direction is beneficial. In the readout direction, the MR image data are fully sampled (i.e. a data entry of raw data has been made at every available memory point) and can be directly subjected to Fourier transformation. This is in contrast to the orthogonal phase coding directions, which are undersampled and are calculated with the use of other reconstruction methods (parallel imaging/iterative reconstruction/compressed sensing). It is therefore generally possible to reconstruct the scanned MR image data in the readout direction independently of one another. (The only limitation is that possible additionally introduced noise-removal terms/regularizations do not work in this direction.) In the example of a transverse scan with readout from left to right, therefore, sagittal slices can be calculated separately.

It is further possible to subdivide the different navigator data sets in the temporal sequence into different time portions, wherein the use of the cluster analysis and the allocation of the navigator data sets to the N movement states are carried out in each of the time portions individually. Differences between the N movement states in the individual time portions can be minimized. Since, for example, the contrast in the navigator data can change over time, such as because of the administration of a contrast agent, or if the magnetization is adjusted with preparation pulses, different magnetizations can arise over the temporal sequence. It is advantageous to carry out the cluster analysis in accordance with the invention not over the whole scan time of the navigator data, but over smaller time intervals, specifically the different time intervals in which such contrast changes are less marked.

It is further possible to carry out a pre-processing of the navigator data before the implementation of the cluster analysis. This pre-processing can include different steps. The navigator data that are present, for example, as projections in the readout direction, can be subjected to a filtration, wherein the filtration can take place in the temporal sequence of the navigator data or in the projection direction or in both directions. The filtration can be a low-pass filtration or an averaging filtration or median filtration. A further possibility of the pre-processing is the use of a principal component analysis or an independent component analysis. This pre-processing can help to reduce the dimension of the navigator data.

Furthermore, the associated magnetic resonance system is provided to implement the aforementioned method with a data acquisition scanner for acquisition of the diagnostic MR signals and the MR navigation data. A computer is configured to execute the cluster analysis and the allocation of the imaging signals to the N movement states.

According to a further aspect of the invention, a method for generating MR navigator data of a person under examination is provided in order to determine movement states occurring in the person under examination. For this purpose, multiple MR navigator data sets of the person under examination are acquired. In addition, diagnostic MR signals for the creation of the MR images are acquired that represent at least one region of the person under examination. During the acquisition of the MR navigator data sets, at least one RF excitation pulse is used that is identical to the at least one RF excitation pulse that is used during the acquisition of the diagnostic MR signals. Further, during the acquisition of the MR navigator data sets, an excitation volume is excited in the person under examination that is identical to the excitation volume that is excited in the person under examination during the acquisition of the diagnostic MR signals.

By the use of the same RF excitation pulses and excitation volumes, the equilibrium magnetization that may exist during the acquisition of the diagnostic MR signals is not disrupted. By this method, the portion of the overall data acquisition sequence for generating the MR navigator imaging signals can be well integrated into the imaging sequences that are used for the acquisition of the MR imaging signals. For example, the sequence part for the MR navigator data can be integrated into the imaging sequence of a preparation module, for example, a fat suppression.

The invention further encompasses an MR system designed to implement the method as described above.

The invention also encompasses a non-transitory, computer-readable data storage medium encoded with programming instructions (program code) that, when the storage medium is loaded into a control computer or computer system of an MR system, cause the control computer or computer system to operate the MR system in order to implement the method as described above.

The features described above and the features which will be disclosed below can be used not only in the corresponding explicitly described combinations, but also in further combinations or in isolation without departing from the protective scope of the present invention.

DESCRIPTION OF THE PREFERRED EMBODIMENTS

Figure 1:
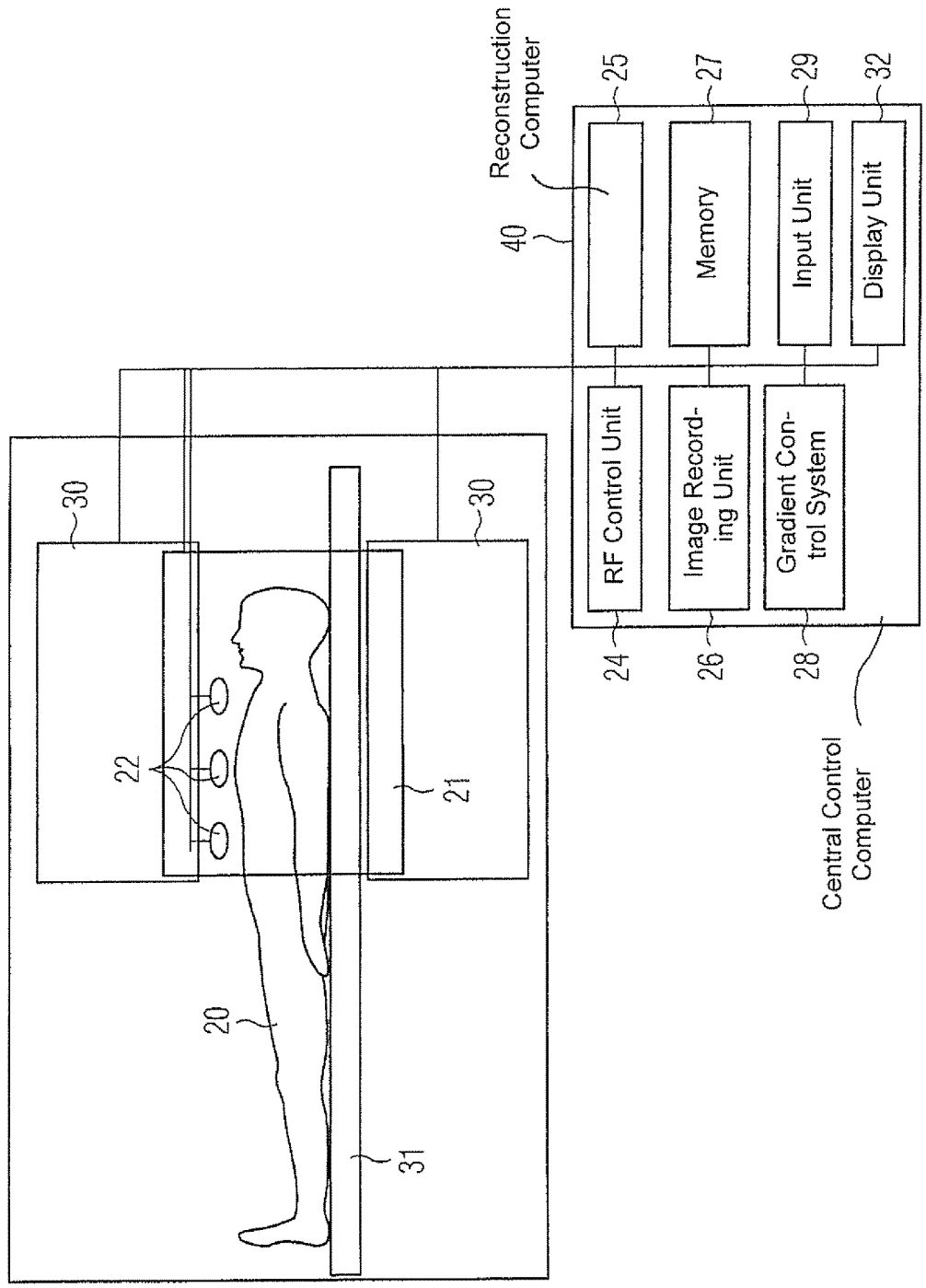
FIG. 1 schematically shows an MR system that is operable according to the invention to combine MR navigator signals with an MR imaging sequence in order to divide the imaging signals acquired in the imaging sequence into different movement states, wherein the determination of the movement states takes place using a cluster analysis.

The present invention will now be described in greater detail on the basis of preferred embodiments, making reference to the accompanying drawings. In the figures, the same reference signs denote the same elements. The figures are also schematic representations of different embodiments of the invention. Elements shown in the drawings are not necessarily shown to scale. Rather, the different elements shown in the drawings are reproduced so that their function and purpose are comprehensible to a person skilled in the art. Connections shown in the drawings between different units can be implemented as direct or indirect connections. A connection can be implemented wire-bound or wirelessly.

Functional units can be implemented as hardware, software or a combination of hardware and software.

FIG. 1 is a block diagram of an MR system with which the inventive method described in detail below can be carried out. A basic field magnet 30 generates a temporally constant strong magnetic field for polarization or orientation of the nuclear spins in the person under examination 20. The person under examination 20 is moved on a table 31 into the scanner of the MR system. In the MR scanner, a whole body coil 21 generates an RF field to create RF excitation pulses. FIG. 1 also shows local transmitting/receiving coils 22 that are configured to cover or partially surround particular parts of the person under examination 20. The local transmitting/receiving coils 22 are freely positionable within an examination region. The MR scanner also has a gradient arrangement (not shown) for generating the magnetic field gradients. Furthermore, the MR scanner has a central control computer 40 for control of all components. This has an RF control unit 24, an image recording unit 26 and a gradient control system 28. A reconstruction computer 25 is also provided that can be used, inter alia, to calculate the MR images and for cluster analysis, as will be described in detail below. The reconstruction computer 25 can have a number of processors (not shown). In a memory 27, program modules, which are necessary for executing the method according to the invention, can be stored. Furthermore, pre-defined imaging sequences can be stored in the memory 27. Via an input unit 29, an operator can control the MR system and on a display unit 32, the MR images or navigator data reproduced can be displayed. The RF control 24 controls the radiation of the RF pulses by the whole body coil 21 and/or the local transmitting/receiving coils 22. The gradient control system 28 controls the switching (activation) of the magnetic field gradients in a temporal sequence. The image recording unit 26 controls the temporal sequence in which the RF pulses and magnetic field gradients are switched and thus also controls the RF control unit 24 and the gradient control system 28. The acquisition of MR signals and calculation of image data through the radiation of RF pulses and the switching of magnetic field gradients is in principle known to those skilled in the art thus need not be described in greater detail herein. In the following, the functioning of the MR system is restricted to a description of the procedures and components that are important for the understanding of the invention.

As noted above, the method can be implemented by the execution of program code from a non-transitory, computer-readable data storage medium that is loaded into the central control computer 40. The aforementioned program code, when executed by the control computer 40, cause the control computer 40 to operate the MR system shown in FIG. 1 so as to implement any or all embodiments of the method described below.

Figure 2:
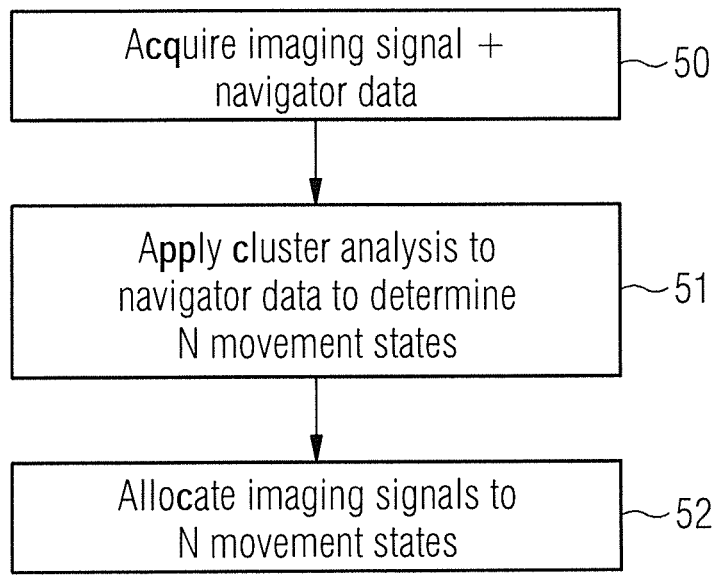
FIG. 2 is a flowchart of the method according to the invention implemented by the MR system shown in FIG. 1.

In conjunction with FIG. 2, it will now be described how, with the use of navigator data, imaging signals can be allocated to different movement states. In a first step 50, the acquisition of the imaging signals and the navigator data of a part, for example, the abdomen of the person under examination 20 in FIG. 1 takes place. The acquisition of the MR signals can be carried out during the free breathing movement of the person under examination 20. For example, the region being examined can include the liver of the person under examination. However, other examination objects are also conceivable. A 3D gradient echo sequence, for example, can be used as the imaging sequence. In this 3D imaging sequence, for example, in the phase encoding direction, not all the phase encoding steps are recorded. The distribution of the phase encoding steps from the raw data center to the outer edge can follow, for example, a Gaussian distribution where, at the outermost edge, the probability in the phase encoding direction falls to a fifth as compared with the central region in the phase encoding direction. At the same time as this imaging sequence which leads to the acquisition of the MR imaging signals, MR navigator data or the MR signals for the generation of the MR navigator data are acquired. The additional navigator data can also be acquired with a gradient echo sequence, the imaging parameters of the MR navigator imaging sequence corresponding and being identical to the imaging parameters of the MR imaging sequence. In particular, the same RF pulses and the same excitation volumes are used in order to not to disrupt the magnetization equilibrium from the imaging sequence. However, the readout direction is parallel to the primary movement direction. Since the primary movement direction of the diaphragm of the person under examination 20 lies in the head-feet direction, the readout direction can be arranged in the head-feet direction.

For example, approximately every 50 ms, every 300 ms or every 500 ms, a navigator imaging sequence can be initiated so that the breathing movement of the person under examination 20 can be tracked in a high temporal resolution.

In the next step 51, a cluster analysis is applied to the navigator data acquired in step 50. As will be described in detail below, the movements of the examined objects can thereby be subdivided into N movement states. Herein, however, the number N of the movement states is stipulated in advance. In a cluster analysis of this type, from a number of similar objects, in this case the navigator data, a previously known number, specifically the number N of groups is formed. For example, the k-space clustering algorithm can be used. Such an algorithm is readily usable for the grouping of objects, in this case the navigator data, since it finds the centers of the clusters rapidly. It is the goal of this type of clustering algorithm to divide the set of acquired navigator data into N groups so that the total of the square deviations from the cluster centroids is a minimum. Of course, any other method of cluster analysis can also be used.

Mathematically, this means that the following equation must be minimized:

$$x^2 = \sum_{c=1}^{N}\sum_{r=1}^{R}\sum_{i \in C_{c,r}}|D_{i,r} - m_{c,r}|^2 + \sum_{c=1}^{N}\sum_{r=1}^{R}\sum_{s=1}^{R}\omega_{c,r,s}|m_{c,s} - m_{c,r}|^2 \quad (1)$$

Herein, N is the number of clusters and thus the number of the movement states, r and s are the number of repetitions.

Herein, repetitions mean the number of reconstructed time points/time portions. In the first term, the deviations from a representative movement state are measured for each time portion/repetition. The second term forces a similarity between movement states at different time points/repetitions. For the implementation, $\omega_{c,r,s} = c\, \delta_{r,s+1}$ is selected, where $\delta$ is the Kronecker-Delta and c is a selectable parameter.

$C_{c,r}$ is the set of navigator scans for repetition r, the repetition r and cluster c. $D_{i,r}$ is the ith navigator data set at repetition r. $m_{c,r}$ describes the cluster centroid for cluster c and repetition r. It is an aim to determine non-overlapping sets $C_{c,r}$ so that each navigator data set is allocated to a cluster with simultaneous optimization of the cluster centroids $m_{c,r}$. The second addition term in equation (1) is the so-called penalty term.

In the present case, the following simplified version of equation (1) can be used:

$$x^2 = \sum_{c=1}^{N}\sum_{r=1}^{R}\sum_{i \in C_{c,r}} |D_{i,r} - m_{c,r}|^2 + c\sum_{c=1}^{N}\sum_{r=1}^{R-1}|m_{c,r+1} - m_{c,r}|^2 \quad (2)$$

As described above, this corresponds to the selection $\omega_{c,r,s} = c\, \delta_{r,s+1}$. This means that the same movement states are compared in adjacent time portions/repetitions. In addition, for example, next-but-one time portions/repetitions can also be taken into account. Computationally, this is the same amount of effort.

An interesting point in equation (2) is that the first term is dependent on the size of the allocation between the repetitions. This means that for a repetition r, the allocations can be adjusted compared with a further repetition s. The last term of equation (2) attempts this allocation.

This minimization can be carried out for each coil element in the acquisition with a number of coil elements and the configuration which has the best relative improvement as compared with the cumulative variance is selected.

The clustering algorithm can thus consist of the following iteration and have the following iteration steps:
- the best cluster centroids $m_{r,r}$ are determined by minimizing a linear problem,
- the cluster allocations are renewed step by step beginning with the first repeat in order to minimize the second term of equation (2),
- each navigator data set is allocated anew in order to minimize the possible functions one after another, and particular clusters are filled.

Using the cluster centroids, the following equation results:

$$x^2 = \sum_{c=1}^{N}\sum_{r=1}^{R}\left(\sum_{i \in C_{c,r}} 1\right)|M_{c,r} - m_{c,r}|^2 + \quad (3)$$

$$\sum_{c=1}^{N}\sum_{r=1}^{R}\sum_{i \in C_{c,r}} |\delta_{i,r}|^2 + c\sum_{c=1}^{N}\sum_{r=1}^{R-1}|m_{c,r+1} - m_{c,r}|^2,$$

so that $$\frac{\partial x^2}{\partial m_{c,r}^\dagger} = \left(\sum_{i \in C_{c,r}} 1\right)(m_{c,r} - M_{c,r}) + \quad (4)$$

$$c(1 - \delta_{r,1})(m_{c,r} - m_{c,r-1}) + c(1 - \delta_{r,R})(m_{c,r+1} - m_{c,r}).$$

This corresponds to solving the linear equation $$n_{c,r} M_{c,r} = \sum_{s=1}^{R} A_{r,s}^{(c)} m_{c,s}, \quad (5)$$

where $n_{c,r} = \Sigma_{i \in C_{c,r}} 1$ and $$A_{r,s}^{(c)} = n_{c,r}\delta_{r,s} + c(1-\delta)\delta_{r,s} + c(1-\delta_{r,R})\delta_{r,s} - c(1-\delta_{r,1})\delta_{r-1,s} - c(1-\delta_{r,R})\delta_{r+1,s} \quad (6)$$

With reference again to FIG. 2, this means finally that the N movement states of the person under examination have been determined, i.e. it can be stated where the moved object is in the respective movement state.

In step 52, the imaging signals, i.e. each raw data point, can be allocated to one of the N movement states.

In a further step (not shown), it is then possible to reconstruct the imaging signals to MR images. Since each raw data point of the imaging signals has been allocated to a movement state, it is thus possible to use the movement state as a further index. The corresponding three-dimensional data set of the MR imaging signals can then be converted into MR images in an iterative reconstruction making use of the following equation:

$$\min_{I}(\|FI - D\|_2^2 + \lambda\|WI\|_1). \quad (7)$$

Herein, F indicates the multiplication by the coil sensitivities, Fourier transform and takes account of the masking, I is the 3D volume data which have been extended by one movement state, D is the imaging signals acquired in the raw data space, which have as parameters the raw data space, the time point and the movement state. The last term is a penalty term, wherein $\lambda$ is the regularization strength and W is a redundant wavelet transform. As stated in equation (7), the first term is a quadratic L2 norm.

Figure 4:
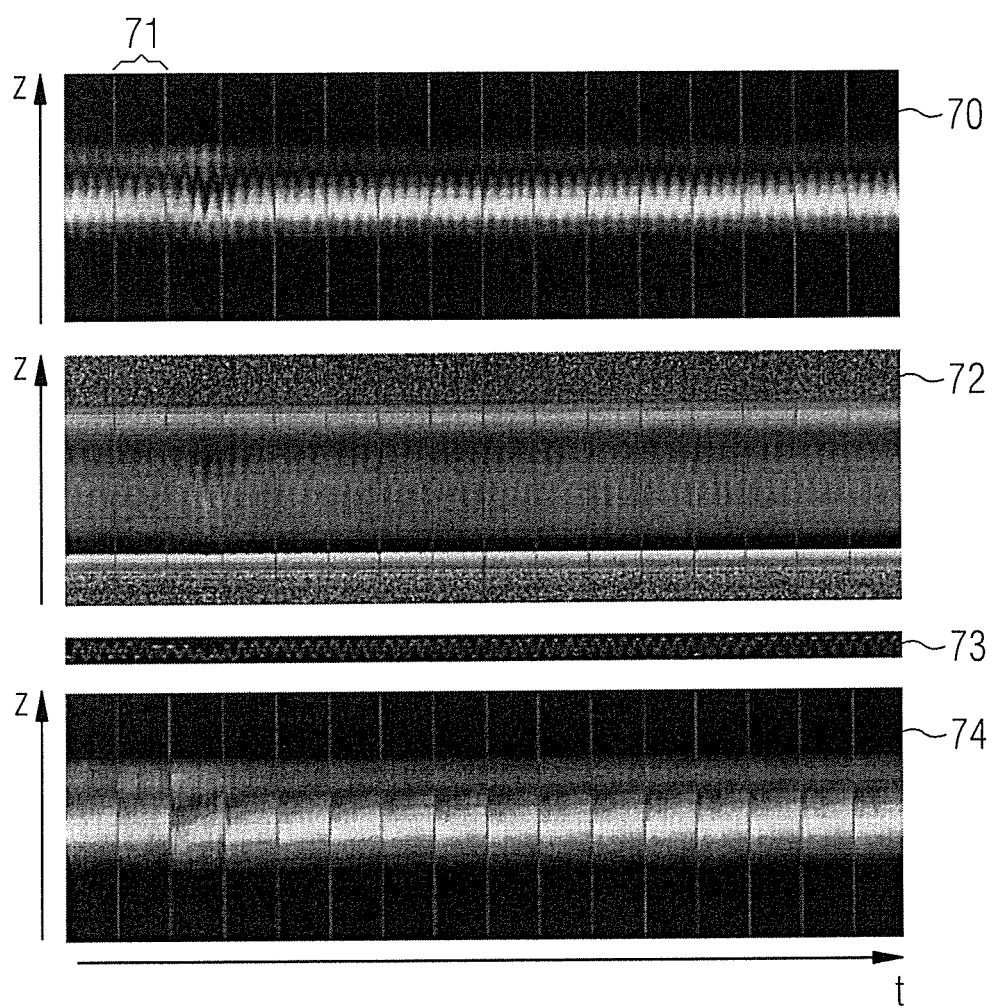
FIG. 4 shows a magnitude and phase signal of different navigator data sets, and shows the allocation to different movement states, of navigator data sorted according to movement states.

In an optional step, before the use of the cluster analysis, a pre-processing of the navigator data takes place in step 51. For example, this pre-processing can contain filtration of the data. The navigator data can be represented as a two-dimensional image with the projection direction shown against the acquisition time, as can be seen in FIG. 4. Since the navigator data typically has a magnetic field gradient less in a spatial direction than the fully spatially-resolved imaging, a two-dimensional representation with projection direction and time is possible. The images can herein be filtered in both spatial directions, i.e. in the projection direction and in the time direction, for example, by an averaging filter or a median filter. Since the navigator data is strongly correlated, methods such as principal component analysis (PCA), singular value composition or independent component analysis (LPCA) can be carried out in order to reduce the dimension of the navigator signal. In the extreme case, the signal can be reduced to a real number at each acquisition time point.

Figure 3:
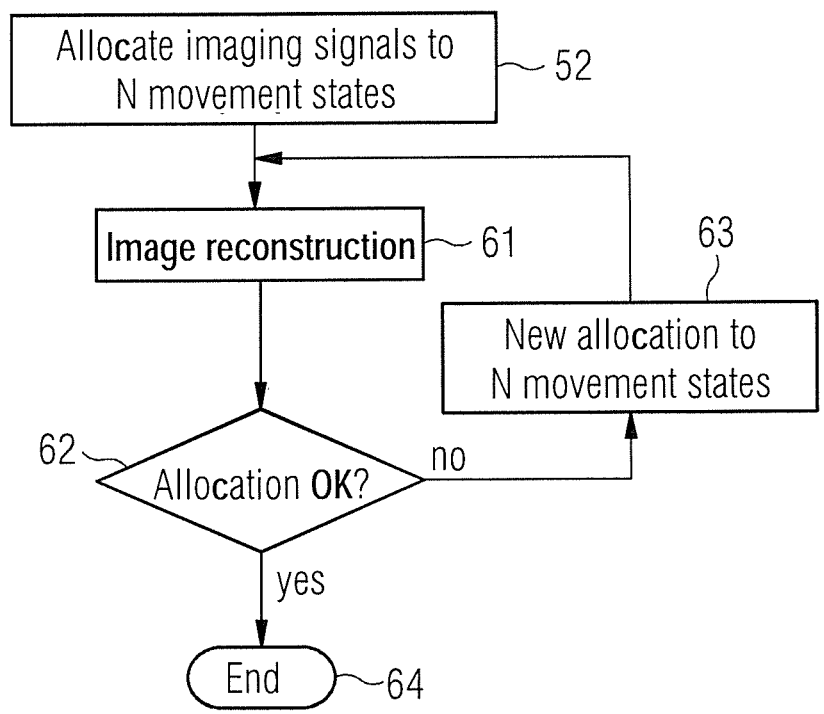
FIG. 3 is a flowchart of a further method according to the present invention.

FIG. 3 is a flowchart with further aspects. As described in relation to step 52 of FIG. 2, the allocation of the imaging data to the N movement states takes place. It has also been described above how thereafter an image reconstruction can take place. This is illustrated here in step 61. As mentioned, in this image reconstruction, the movement state has been used as the additional dimension. In step 62, it is checked whether the allocation to the movement states is satisfactory. The calculated images can be inverse-transformed into k-space and each state compared with the measured data individually according to a measure. If a measured data point fits better to another time point, then it can be allocated anew. The allocation according to this procedure can be carried out for all data points (if only one or not all points are reconstructed in the readout direction, the whole readout train is allocated to the best movement state). Once a new allocation is obtained, the image data is arranged in the order of its acquisition and subsequently the movement states are filtered (low-pass filter or median filter). Underlying this is that the movement state varies continuously and slower than the data acquisition.

If the allocation in step 62 is not satisfactory, then in step 63, a new allocation of the measured imaging signals to different movement states can take place. As a reference for these movement states, the calculated images are used. When images are calculated based on an allocation, they can be inverse transformed for all the movement states.

Subsequently, in step 61, an image reconstruction can take place, wherein the steps 61 to 63 can be repeated so often until a satisfactory allocation has been achieved. The method then ends at step 64.

FIG. 4 shows at top the magnitude signal of the navigator data for a coil element, wherein the magnitude signal 70 is represented against time. In the present case, the navigator data signal is subdivided into 16 time portions 71. In the time portions 71, or bins, for each of these time portions, the navigator data are then subjected to the cluster analysis. The second signal shown in FIG. 4 is the phase signal 72 over time. Subsequently, in 73, the allocated movement states are shown. In 74, the navigator data are sorted in each time interval 71 according to movement states. Thus a sequence is obtained for structures such as the diaphragm. This is also desirable here since, from the navigator dataset, conclusions are to be drawn regarding the movement. The division into the different time intervals and the performance of the cluster analysis takes place for the individual time intervals 71, since the contrast of the MR signals and thus of the navigator signals can change over time, for example on administration of contrast media or if the magnetization is adjusted with preparation pulses at the start of the scan. It is therefore advantageous not to carry out the cluster analysis over the entire scan time, but over the individual time intervals in which such contrast changes are less important. The movement states between the different time intervals can be adapted to one another in that it is determined that the movement states should change as little as possible, which can be achieved with an additional term or additional terms in the optimization function, as given in equations (1) and (2) in the second term.

In summary, the present invention enables an effective and simple, as well as time-saving, allocation of a movement to movement states so that scans can be performed without the natural movement, for example, the breathing movement, being stopped.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) data, comprising:
   operating an MR data acquisition scanner to acquire sets of MR diagnostic data from a living subject that represent at least one region of the subject, said subject exhibiting N different movement states during acquisition of said sets of MR diagnostic data;
   also operating said MR data acquisition scanner to acquire a plurality of MR navigator data sets from the subject that are respectively associated with individual ones of said sets of MR diagnostic data;
   providing the acquired sets of MR diagnostic data and the acquired plurality of MR navigator data sets to a computer and, in said computer, applying a cluster analysis to said plurality of MR navigator data sets to identify similarities among the respective MR navigator data sets and to allocate similar MR navigator data sets to a respective movement state of said subject, among said N movement states, so that each MR navigator data set in said plurality of MR navigator data sets is respectively allocated to one of said N movement states; and
   in said computer, allocating the acquired sets of MR diagnostic data to the same respective N movement states to which the MR navigator data set associated therewith was allocated, and making the plurality of MR navigator data sets respectively allocated to movement states, and the sets of MR diagnostic data allocated to the N movement states, available from the computer in electronic form as a data file.

2. A method as claimed in claim 1 comprising associating the respective individual MR navigator data sets with individual ones of said sets of MR diagnostic data by operating said MR data acquisition scanner to acquire said MR navigator data sets respectively following radiation of a radio-frequency (RF) excitation pulse that is identical to an RF excitation pulse radiated for the acquisition of one of said MR diagnostic data sets.

3. A method as claimed in claim 1 comprising operating said MR data acquisition scanner to acquire said sets of MR diagnostic data from said region of the subject that comprises an excitation volume, and acquiring said plurality of MR navigator data sets from the same excitation volume.

4. A method as claimed in claim 1 wherein said N different movement states of the subject occur in a primary movement direction, and operating said MR data acquisition scanner to acquire said plurality of MR navigator data sets by activating a readout gradient in a readout direction that is parallel to said primary movement direction.

5. A method as claimed in claim 1 comprising entering the acquired sets of MR diagnostic data as raw data into a raw data memory at respective raw data points in said memory, and allocating said sets of MR diagnostic data to said N movement states by allocating each raw data point thereof to one of said N movement states.

6. A method as claimed in claim 1 comprising, in an image reconstruction computer having access to said data file, reconstructing an image of said region of the subject from said sets of MR diagnostic data by executing an iterative reconstruction algorithm with each state associated with said sets of MR diagnostic data being used as a dimension in said iterative reconstruction algorithm.

7. A method as claimed in claim 1 comprising, before executing said cluster analysis in said computer, implementing a pre-processing of said plurality of MR navigator data sets in said computer, said pre-processing comprising at least one of:
   subjecting respective MR navigator data sets, which are present as projections in a readout direction along which said plurality of MR navigator data sets were acquired, to a filtration in at least one direction selected from the group consisting of a direction representing a temporal sequence of said plurality of MR navigator data sets and said projection direction;
   implementing a principal component analysis on said plurality of MR navigator data sets; and
   implementing a singular value decomposition on said plurality of MR navigator data sets.

8. A method as claimed in claim 1 comprising:
   in a reconstruction computer having access to said data file, reconstructing an MR image of said region of the subject from said sets of MR diagnostic data by executing a reconstruction algorithm; and
   in said reconstruction algorithm, using the reconstructed MR image to check whether the allocation of the sets of MR diagnostic data to the N movement states is in need of adjustment, by selecting a representative MR image for each of said N movement states and comparing the respective representative MR images with the reconstructed MR images, and renewing allocation of the sets of MR diagnostic data to the N movement states with said comparison does not satisfy a predetermined comparison criterion.

9. A method as claimed in claim 1 wherein said plurality of MR navigator data sets are acquired in a temporal sequence, and comprising, in said computer, dividing said temporal sequence into a plurality of different time segments, and executing said cluster analysis, and allocating respective MR navigator data sets to said N movement states, in each of said time segments individually, and simultaneously minimizing differences between said N movement states between respective individual time segments.

10. A magnetic resonance (MR) apparatus comprising:
an MR data acquisition scanner;
a computer configured to operate said MR data acquisition scanner to acquire sets of MR diagnostic data from a subject that represent at least one region of the subject, said subject exhibiting N different movement states during acquisition of said sets of MR diagnostic data;
said computer being configured to also operate said MR data acquisition scanner to acquire a plurality of MR navigator data sets from the subject that are respectively associated with individual ones of said sets of MR diagnostic data;
said computer being configured to receive the acquired sets of MR diagnostic data and the acquired plurality of MR navigator data sets and to execute a cluster analysis on said plurality of MR navigator data sets to identify similarities among the respective MR navigator data sets and to allocate similar MR navigator data sets to a respective movement state of said subject, among said N movement states, so that each MR navigator data set in said plurality of MR navigator data sets is respectively allocated to one of said N movement states; and
said computer being configured to allocate the acquired sets of MR diagnostic data to the respective N movement states to which the MR navigator data set associated therewith was allocated, and to make the plurality of MR navigator data sets respectively allocated to movement states, and the sets of MR diagnostic data allocated to the N movement states, available from the computer in electronic form as a data file.

11. An apparatus as claimed in claim 10 wherein said computer is configured to associate the respective individual MR navigator data sets with individual ones of said sets of MR diagnostic data by operating said MR data acquisition scanner to acquire said MR navigator data sets respectively following radiation of a radio-frequency (RF) excitation pulse that is identical to an RF excitation pulse radiated for the acquisition of one of said sets of MR diagnostic data.

12. An apparatus as claimed in claim 10 wherein said computer is configured said MR data acquisition scanner to acquire said sets of MR diagnostic data from said region of the subject that comprises an excitation volume, and to acquire said plurality of MR navigator data sets from the same excitation volume.

13. An apparatus as claimed in claim 10 wherein said N different movement states of the subject occur in a primary movement direction, and wherein said computer is configured to operate said MR data acquisition scanner to acquire said plurality of MR navigator data sets by activating a readout gradient in a readout direction that is parallel to said primary movement direction.

14. An apparatus as claimed in claim 10 comprising a raw data memory, and wherein said computer is configured to enter the acquired sets of MR diagnostic data as raw data into a raw data memory at respective raw data points in said sets of memory, and to allocate said sets of MR diagnostic data to said N movement states by allocating each raw data point thereof to one of said N movement states.

15. An apparatus as claimed in claim 10 wherein said computer is configured to operate as an image reconstruction computer having access to said data file, and to reconstruct an image of said region of the subject from said sets of MR diagnostic data by executing an iterative reconstruction algorithm with each state associated with said sets of MR diagnostic data being used as a dimension in said iterative reconstruction algorithm.

16. An apparatus as claimed in claim 10 wherein said computer is configured to:
operate as a reconstruction computer having access to said data file, to reconstruct MR images of said region of the subject from said sets of MR diagnostic data by executing a reconstruction algorithm; and
in said reconstruction algorithm, use the reconstructed MR images to check whether the allocation of the sets of MR diagnostic data to the N movement states is in need of adjustment, by selecting a representative MR image for each of said N movement states and comparing the respective representative MR images with the reconstructed MR images, and renewing allocation of the sets of MR diagnostic data to the N movement states with said comparison does not satisfy a predetermined comparison criterion.

17. An apparatus as claimed in claim 10 wherein said computer is configured to operate said MR data acquisition scanner to acquire said plurality of MR navigator data sets in a temporal sequence, and to divide said temporal sequence into a plurality of different time segments, and to execute said cluster analysis, and allocate respective MR navigator data sets to said N movement states, in each of said time segments individually, and to simultaneously minimize differences between said N movement states between respective individual time segments.

18. A method for acquiring magnetic resonance (MR) data from a living subject, comprising:
operating an MR data acquisition scanner to acquire a plurality of MR navigator data sets from a subject, said subject exhibiting movement, exhibiting a primary movement direction, during acquisition of said MR navigator data sets;
operating said MR data acquisition scanner to acquire said plurality of MR navigator data sets by radiating at least one radio-frequency (RF) excitation pulse that excites nuclear spins in at least one excitation volume of the subject and by activating a readout gradient in a readout direction that is parallel to said primary movement direction;
also operating said MR data acquisition scanner to acquire MR signals from at least one region of the subject; and
operating said MR data acquisition scanner to acquire said MR signals by radiating at least one RF excitation pulse, which is identical to said at least one RF excitation pulse used to acquire said MR navigator data sets, that excites at least one RF excitation volume in the subject, that is identical to the at least one RF excitation volume excited by the at least one RF excitation pulse for acquiring said MR navigator data sets, said at least one RF excitation volume from which said MR signals are acquired being comprised in said region of said subject.

19. A magnetic resonance apparatus comprising:
an MR data acquisition scanner;
a computer configured to operate said MR data acquisition scanner to acquire a plurality of MR navigator data sets from a subject, said subject exhibiting movement, exhibiting a primary movement direction, during acquisition of said MR navigator data sets;
a computer configured to operate said MR data acquisition scanner to acquire said plurality of MR navigator data sets by radiating at least one radio-frequency (RF) excitation pulse that excites nuclear spins in at least one excitation volume of the subject and by activating a readout gradient in a readout direction that is parallel to said primary movement direction;
a computer configured to also operate said MR data acquisition scanner to acquire MR signals from at least one region of the subject; and
a computer configured to operate said MR data acquisition scanner to acquire said MR signals by radiating at least one RF excitation pulse, which is identical to said at least one RF excitation pulse used to acquire said MR navigator data sets, that excites at least one RF excitation volume in the subject, that is identical to the at least one RF excitation volume excited by the at least one RF excitation pulse for acquiring said MR navigator data sets, said at least one RF excitation volume from which said MR signals are acquired being comprised in said region of said subject.

20. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
operate said MR data acquisition scanner to acquire sets of MR diagnostic data from a living subject that represent at least one region of the subject, said subject exhibiting N different movement states during acquisition of said sets of MR diagnostic data;
also operate said MR data acquisition scanner to acquire a plurality of MR navigator data sets from the subject that are respectively associated with individual ones of said sets of MR diagnostic data;
receive the acquired sets of MR diagnostic data and the acquired plurality of MR navigator data sets and apply a cluster analysis to said plurality of MR navigator data sets to identify similarities among the respective MR navigator data sets and to allocate similar MR navigator data sets to a respective movement state of said subject, among said N movement states, so that each MR navigator data set in said plurality of MR navigator data sets is respectively allocated to one of said N movement states; and
allocate the acquired sets of MR diagnostic data to the respective N movement states to which the MR navigator data set associated therewith was allocated, and make the plurality of MR navigator data sets respectively allocated to movement states, and the sets of MR diagnostic data allocated to the N movement states, available from the computer in electronic form as a data file.

21. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
operate said MR data acquisition scanner to acquire a plurality of MR navigator data sets from a subject, said subject exhibiting movement, exhibiting a primary movement direction, during acquisition of said MR navigator data sets;
operate said MR data acquisition scanner to acquire said plurality of MR navigator data sets by radiating at least one radio-frequency (RF) excitation pulse that excites nuclear spins in at least one excitation volume of the subject and by activating a readout gradient in a readout direction that is parallel to said primary movement direction;
also operate said MR data acquisition scanner to acquire MR signals from at least one region of the subject; and
operate said MR data acquisition scanner to acquire said MR signals by radiating at least one RF excitation pulse, which is identical to said at least one RF excitation pulse used to acquire said MR navigator data sets, that excites at least one RF excitation volume in the subject, that is identical to the at least one RF excitation volume excited by the at least one RF excitation pulse for acquiring said MR navigator data sets, said at least one RF excitation volume from which said MR signals are acquired being comprised in said region of said subject.

* * * * *